United States Patent
Tornare et al.

(10) Patent No.: US 11,264,978 B2
(45) Date of Patent: Mar. 1, 2022

(54) CIRCUIT FOR PROCESSING A LOGIC INPUT

(71) Applicants: Continental Automotive France, Toulouse (FR); Continental Automotive GmbH, Hannover (DE)

(72) Inventors: Jean-Marc Tornare, Toulouse (FR); Luigi Guglielmini, Toulouse (FR); Nicolas Piques, Toulouse (FR)

(73) Assignees: Continental Automotive France; Continental Automotive GmbH

(*) Notice: Subject to any disclaimer, the term of this patent is extended or adjusted under 35 U.S.C. 154(b) by 0 days.

(21) Appl. No.: 17/261,275

(22) PCT Filed: Jul. 18, 2019

(86) PCT No.: PCT/EP2019/069363
§ 371 (c)(1),
(2) Date: Jan. 19, 2021

(87) PCT Pub. No.: WO2020/020737
PCT Pub. Date: Jan. 30, 2020

(65) Prior Publication Data
US 2021/0281255 A1    Sep. 9, 2021

(30) Foreign Application Priority Data

Jul. 25, 2018 (FR) .................. 1856897

(51) Int. Cl.
*H03K 5/00* (2006.01)
*H03K 5/24* (2006.01)

(52) U.S. Cl.
CPC ............ *H03K 5/2409* (2013.01); *H03K 5/24* (2013.01); *H03K 5/2418* (2013.01); *H03K 5/2481* (2013.01)

(58) Field of Classification Search
None
See application file for complete search history.

(56) References Cited

U.S. PATENT DOCUMENTS

| | | | |
|---|---|---|---|
| 2016/0094206 A1* | 3/2016 | Sano | H03K 3/014 331/150 |
| 2019/0310677 A1* | 10/2019 | Terasaki | G01R 31/40 |
| 2019/0310700 A1* | 10/2019 | Waters | G06F 1/3209 |

FOREIGN PATENT DOCUMENTS

WO    2007038168 A1    4/2007

OTHER PUBLICATIONS

Engliish translation of Written Opinion for International Application No. PCT/EP2019/069363, dated Aug. 6, 2019, 5 pages.
(Continued)

*Primary Examiner* — Tuan T Lam
(74) *Attorney, Agent, or Firm* — RatnerPrestia

(57) ABSTRACT

A circuit for processing a logic input, including a first comparator capable of comparing the logic input with a first reference voltage and of providing a logic output at a first output logic level if the logic input is higher than the first reference voltage and otherwise at a second output logic level different from the first output logic level. The power supply of the first comparator and the first voltage reference are activated by the logic input.

13 Claims, 2 Drawing Sheets

(56) References Cited

OTHER PUBLICATIONS

International Search Report and Written Opinion for International Application No. PCT/EP2019/069363, dated Aug. 6, 2019, with partial English translation, 8 pages.
International Search Report and Written Opinion for International Application No. PCT/EP2019/069363, dated Aug. 6, 2019, 12 pages (French).

* cited by examiner

CIRCUIT FOR PROCESSING A LOGIC INPUT

CROSS REFERENCE TO RELATED APPLICATIONS

This application is the U.S. National Phase Application of PCT International Application No. PCT/EP2019/069363, filed Jul. 18, 2019, which claims priority to French Patent Application No. 1856897, filed Jul. 25, 2018, the contents of such applications being incorporated by reference herein.

FIELD OF THE INVENTION

The present invention generally relates to the field of motor vehicle electronics. It particularly relates to a circuit for processing a logic input.

BACKGROUND OF THE INVENTION

It is known for a logic input to be processed by means of a circuit, the principle of which is shown in FIG. 1. With reference to FIG. 1, a logic input EL is processed in order to provide a logic output SL. To this end, the input EL is compared, by means of a comparator C, to a reference voltage Vref. If the logic input EL is higher than the reference voltage Vref, then the logic output SL is set to a first output logic level VO1, selected from a high output logic level VOH or a low output logic level VOL. If, on the contrary, the logic input EL is less than the reference voltage Vref, then the logic output SL is set to a second output logic level VO2 different from the first output logic level VO1, that is the other level from the high logic level VOH or the low logic level VOL.

A logic input EL is a voltage signal having a variation ranging between a minimum input voltage VImin and a maximum input voltage VImax. Two acceptance voltage thresholds are defined so as to determine whether a logic input EL has a low logic state or a high logic state: a maximum low input logic level VILmax and a minimum high input logic level VIHmin, with the relation VImin<VILmax<VIHmin<VImax.

A function of a circuit for processing a logic input is to determine the state of a logic input EL and to set an output logic level SL accordingly. It is understood that a logic input EL below the maximum low input logic level VILmax is to be considered to be the low state and that a logic input EL above the minimum high input logic level VIHmin is considered to be the high state. The processing circuit monitors the level of a logic input EL and sets the output logic level accordingly. For a logic input EL considered to be in the high state, the logic output SL is set to a first output logic level VO1, typically a high logic output state VOH. The first output logic level VO1 also can be a low output logic state VOL if the processing circuit is an inverting circuit. For a logic input EL considered to be in the low state, the logic output SL is set to a second output logic level VO2 different from the first output logic level, that is typically a low output logic state VOL if the first output logic level VO1 was a high level VOH.

This allows, among other things, a logic state to be "strengthened" between the input and the output by clearly separating a low level from a high level, the distance between VOL and VOH is typically greater than the distance between VILmin and VIHmax. This also allows a conversion to be implemented: state inversion, voltage level adaptation: for example, an input between 0-5V and an output between −12 and +12V. This also can allow galvanic isolation to be implemented.

To implement such a function, a processing circuit is typically produced according to the schematic diagram of FIG. 1. With the state of a logic input only comprising two values, this state can be determined by comparing the logic input EL with a single threshold provided by a voltage reference Vref. According to the prior art, a circuit for processing a logic input typically comprises a comparator C comparing the logic input EL to a reference voltage Vref and producing an output state SL as a function of this comparison.

If, as in FIG. 1, the comparator C is implemented by an operational amplifier, the output logic level on SL is equal to the power supply VCC of the operational amplifier when the logic input EL is higher than Vref and is equal to 0 when the logic input EL is less than Vref.

A circuit for processing a logic input is particularly adapted to operate upstream or in the absence of a computer, particularly in the standby phases where the battery is not sustained and recharged by the alternator of the motor vehicle. The principle described above detrimentally causes significant and/or continuous electrical consumption for, on the one hand, producing the voltage reference Vref and, on the other hand, for powering the comparator C by means of a power supply VCC. This is particularly detrimental in the standby phases, where such continuous consumption risks discharging the battery of said vehicle.

Furthermore, the specifications of the acceptance thresholds of the high and low input states, namely the maximum low input logic level VILmax and the minimum high input logic level VIHmin, can be very close, with, for example, a difference of less than 1V. This eliminates some excessively simplistic solutions for producing such a processing circuit.

SUMMARY OF THE INVENTION

The aim of an aspect of the invention is to propose a circuit for processing a logic input that consumes little or nothing, in particular in the standby phases, whilst being capable of precisely determining the state, even with a close maximum low input logic level VILmax and a minimum high input logic level VIHmin.

An aspect of the invention relates to a circuit for processing a logic input, comprising a first comparator capable of comparing the logic input with a first reference voltage and of providing a logic output at a first output logic level if the logic input is higher than the first reference voltage and otherwise at a second output logic level different from the first output logic level, wherein the power supply of the first comparator and the first reference voltage are activated by the logic input.

According to another feature, the circuit further comprises a second comparator and a switch, the second comparator being capable of comparing the logic input with a second reference voltage and of controlling the switch so as to power the first reference voltage when the logic input is higher than the second reference voltage and otherwise so as not to power said first reference voltage.

According to another feature, the power supply of the second comparator and the second reference voltage are activated by the logic input.

According to another feature, the second reference voltage is less than the first reference voltage.

According to another feature, the first reference voltage ranges between a minimum high input logic level and a maximum low input logic level, preferably substantially equal to the average of the minimum high input logic level and of the maximum low input logic level.

According to another feature, the second reference voltage is equal to a fraction of the maximum low input logic level, preferably half.

According to another feature, the second reference voltage is higher than an average noise level.

According to another feature, the first comparator is implemented by a first NPN type transistor, the base of which is connected to the logic input, the collector of which is connected to the logic output and the transmitter of which is connected to the first voltage reference, the second comparator is implemented by a second NPN type transistor, the base of which is connected to the logic output, the collector of which is connected to a first terminal of the switch and the transmitter of which is connected to the second voltage reference, and a second terminal of the switch is connected to the common point between the first voltage reference and the transmitter of the first transistor.

According to another feature, the switch is implemented by two flip-flop mounted PNP type transistors: the transmitter of the first transistor is connected to the base of the second transistor and to the transmitter of the second transistor via a resistor and the base of the first transistor is connected to the collector of the second transistor and to the transmitter of the second transistor via a resistor, the transmitter of the second transistor being connected to a biasing potential, the collector of the first transistor forming the first terminal of the switch and the collector of the second transistor forming the second terminal of the switch.

According to another feature, the first voltage reference is implemented by a Zener diode connected to ground by its anode and connected to the first comparator by its cathode, and/or the second reference voltage is implemented by a Zener diode connected to ground by its anode and connected to the second comparator by its cathode.

BRIEF DESCRIPTION OF THE DRAWINGS

Further features and innovative advantages aspects of the invention will become apparent from reading the following description, which is provided by way of a non-limiting example, with reference to the accompanying drawings, in which.

For greater clarity, identical or similar elements are identified with identical reference signs throughout the figures.

DETAILED DESCRIPTION OF THE PREFERRED EMBODIMENTS

Figure 1:
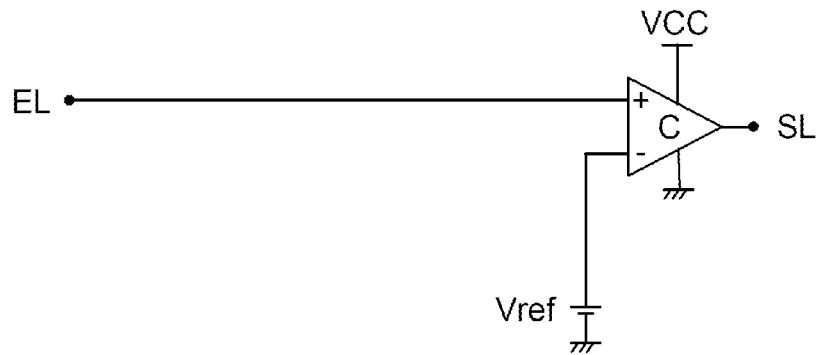
FIG. 1 already described, illustrates the principle of a circuit according to the prior art.
Figure 2:
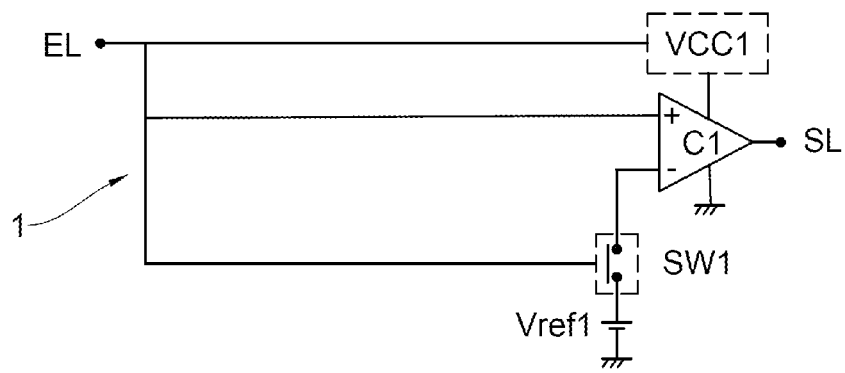
FIG. 2 illustrates a first principle of a circuit according to an aspect of the invention.

The schematic diagram of FIG. 2 shows, compared to the schematic diagram of the prior art of FIG. 1, the fundamental idea of an aspect of the invention. The diagram of FIG. 2 uses the elements of FIG. 1. The processing circuit 1 is capable of processing a logic input EL. It comprises a first comparator C1 capable of comparing the logic input EL with a first reference voltage Vref1. It provides a logic output SL at a first output logic level VO1 if the logic input EL is higher than the first reference voltage Vref1 and otherwise at a second output logic level VO2 different from the first output logic level VO1.

Furthermore, the schematic diagram of FIG. 2 is such that the power supply of the first comparator C1 and the first reference voltage Vref1 (in this case its connection with the input of the first comparator C1) are activated by the logic input EL. Thus, it is the presence of a voltage on the logic input EL that controls the activation of the electrical consumption sources. These consumptions are time-limited to the phases where processing of the logic input EL is required. Furthermore, in the absence of voltage on the logic input EL, the processing circuit 1 consumes nothing or substantially nothing. The activation by the logic input EL in this case extends from a direct supply of power by the logic input EL itself or from a start-up controlled or enabled by the logic input EL or by any other equivalent solution.

The embodiment of FIG. 2 functions, but it has the disadvantage that the activation of the first voltage reference Vref1 can be too sensitive and that this activation is implemented not on a voltage that is actually present on the logic input EL but on a noise.

Figure 3:
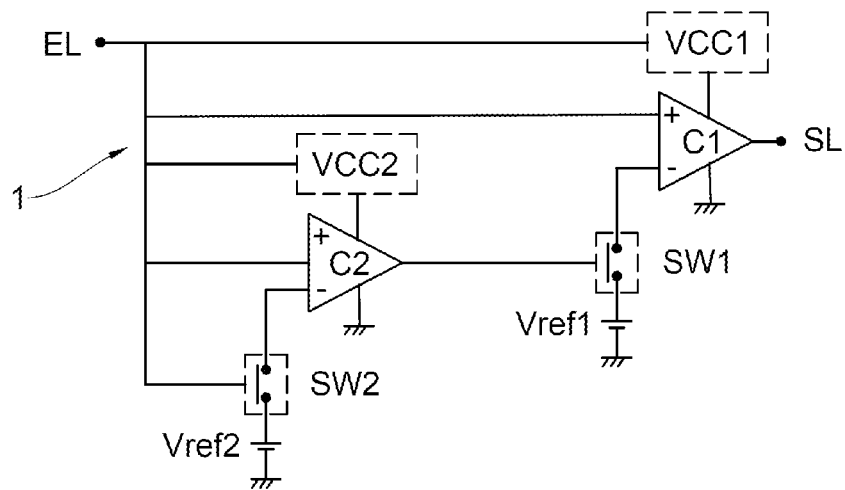
FIG. 3 illustrates another principle of a circuit according to an aspect of the invention.

In order to avoid this disadvantage, according to a preferred embodiment, illustrated in FIG. 3, the processing circuit 1 further comprises a means that only allows an activation for a certain voltage level present on the logic input EL. This means comprises a second comparator C2 and a switch SW1, with the second comparator C2 being capable of comparing the logic input EL with a second reference voltage Vref2 and of controlling the switch SW1 so as to power the first reference voltage Vref1 when the logic input EL is higher than the second reference voltage Vref2 and otherwise not to power the first reference voltage Vref1. Thus, with a second properly selected reference voltage, and which does not have to be very precise, it is possible to only activate the first reference voltage Vref1 when it is really necessary.

Advantageously, the power supply of the second comparator C2 and the second reference voltage Vref2 are activated by the logic input EL, like the power supply of the first comparator C1 and of the first voltage reference Vref1, and for the same reasons.

According to an advantageous feature, the second reference voltage Vref2 is less than the first reference voltage Vref1. Thus, both the first comparator C1 and the first reference voltage Vref1 are activated before they can be used.

The first reference voltage Vref1 is used to distinguish a high input state VIH from a low input state VIL on the logic input EL. Furthermore, it is necessary for the first reference voltage Vref1 to range between a minimum high input logic level VIHmin and a maximum low input logic level VILmax. All the values between these two limits are possible. It is beneficial to be as far away from the limits as the value of the first voltage reference Vref1 is imprecise. Furthermore, according to an advantageous feature, Vref1 is preferably substantially equal to the average of the two limits, that is the average of the minimum high input logic level VIHmin and of the maximum low input logic level VILmax.

According to one embodiment, the second reference voltage Vref2 is taken as equal to a fraction of the maximum low input logic level VILmax, preferably half VILmax/2.

As previously seen, the second reference voltage Vref2 is used to avoid activating the first reference voltage Vref1 on a noise on the logic input EL. Furthermore, advantageously, the second reference voltage Vref2 is higher than an average noise level on said logic input EL.

On the basis of a schematic diagram, such as those shown in FIGS. 2 and 3, a person skilled in the art knows how to realize numerous implementations as a function of the technologies that are implemented and as a function of arbitrary or personal choices.

Figure 4:
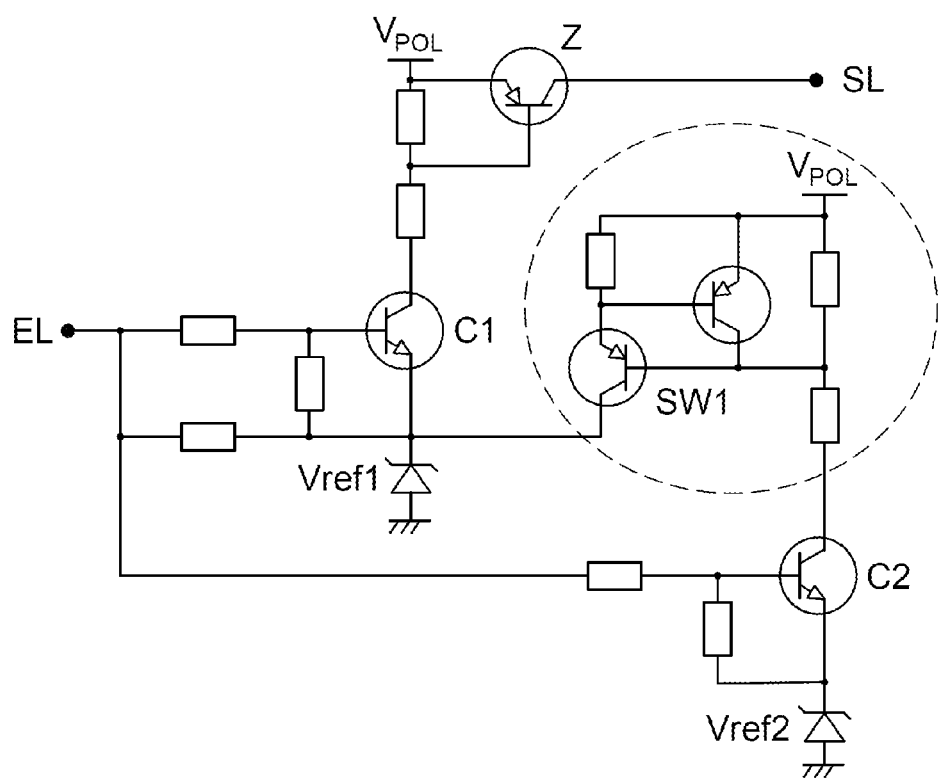
FIG. 4 illustrates a possible embodiment of a circuit according to the invention.

FIG. 4 shows an example of a possible implementation. According to one feature, the first comparator C1 is implemented by a first NPN type transistor. The base of this transistor is connected to the logic input EL, the collector is connected to the logic output SL and the transmitter is connected to the first voltage reference Vref1 and to a second terminal of the switch SW1. According to another feature, the second comparator C2 is implemented by a second NPN type transistor. The base of this transistor is connected to the logic input EL, the collector is connected to a first terminal of the switch SW1 and the transmitter is connected to the second voltage reference Vref2. According to another feature, a second terminal of the switch SW1 is connected to the common point between the first voltage reference Vref1 and the transmitter of the first transistor.

According to another feature, the switch SW1 is implemented by two flip-flop mounted PNP type transistors: the transmitter of the first transistor (on the left-hand side in FIG. 4 in the broken line circle) is connected to the base of the second transistor (on the right-hand side in FIG. 4 in the broken line circle) and to the transmitter of the second transistor via a resistor and the base of the first transistor is connected to the collector of the second transistor and to the transmitter of the second transistor via a resistor, with the transmitter of the second transistor being connected to a biasing potential Vpol, with the collector of the first transistor forming the second terminal of the switch SW1 and the collector of the second transistor forming the first terminal of the switch SW1.

In FIG. 4, the transistor Z allows a voltage adaptation to be implemented. Its presence is optional.

The first voltage reference Vref1 and the second voltage reference Vref2 can be implemented by any voltage reference. It can involve a power supply, a battery or any equivalent means.

In order to simplify the circuit and to reduce its cost, the first voltage reference Vref1 is advantageously implemented by a Zener diode connected to ground by its anode and connected to the first comparator C1 by its cathode. Similarly, the second voltage reference Vref2 is advantageously implemented by a Zener diode connected to ground by its anode and connected to the second comparator C2 by its anode.

An aspect of the invention is described above by way of an example. It is understood that a person skilled in the art is able to produce different variant embodiments of the invention, for example by combining the various features above taken alone or in combination, without departing from the scope of the invention in doing so.

The invention claimed is:

1. A circuit for processing a logic input, comprising a first comparator capable of comparing the logic input with a first reference voltage and of providing a logic output at a first output logic level if the logic input is higher than the first reference voltage and otherwise at a second output logic level different from the first output logic level, wherein the power supply of the first comparator and the first voltage reference are activated by the logic input.

2. The circuit as claimed in claim 1, wherein the first reference voltage ranges between a minimum high input logic level and a maximum low input logic.

3. The circuit as claimed in claim 2, wherein the first reference voltage is substantially equal to an average of the minimum high input logic level and of the maximum low input logic level.

4. The circuit as claimed in claim 1, further comprising a switch activated by the logic input to provide the first reference voltage to the comparator.

5. A circuit for processing a logic input, comprising:
a first comparator capable of comparing the logic input with a first reference voltage and of providing a logic output at a first output logic level if the logic input is higher than the first reference voltage and otherwise at a second output logic level different from the first output logic level, and
a second comparator and a switch, the second comparator being capable of comparing the logic input with a second reference voltage and of controlling the switch so as to power the first reference voltage when the logic input is higher than the second reference voltage and otherwise so as not to power said first reference voltage,
wherein the power supply of the first comparator and the first voltage reference are activated by the logic input.

6. The circuit as claimed in claim 5, wherein the power supply of the second comparator and the second voltage reference are activated by the logic input.

7. The circuit as claimed in claim 5, wherein the second reference voltage is less than the first reference voltage.

8. The circuit as claimed in claim 5, wherein the second reference voltage is equal to a fraction of a maximum low input logic level.

9. The circuit as claimed in claim 5, wherein the second reference voltage is higher than an average noise level.

10. The circuit as claimed in claim 5, wherein the first comparator is implemented by a first NPN type transistor, the base of which is connected to the logic input, the collector of which is connected to the logic output and the transmitter of which is connected to the first voltage reference, the second comparator is implemented by a second NPN type transistor, the base of which is connected to the logic input, the collector of which is connected to a first terminal of the switch and the transmitter of which is connected to the second voltage reference, and a second terminal of the switch is connected to the common point between the first voltage reference and the transmitter of the first transistor.

11. The circuit as claimed in claim 5, wherein the switch is implemented by two flip-flop mounted PNP type transistors: the transmitter of the first transistor is connected to the base of the second transistor and to the transmitter of the second transistor via a resistor and the base of the first transistor is connected to the collector of the second transistor and to the transmitter of the second transistor via a resistor, the transmitter of the second transistor being connected to a biasing potential, the collector of the first transistor forming the first terminal of the switch and the collector of the second transistor forming the second terminal of the switch.

12. The circuit as claimed in claim 5, wherein the first voltage reference is implemented by a Zener diode, the anode of which is connected to ground and the cathode of which is connected to the first comparator, and/or the second voltage reference is implemented by a Zener diode, the anode of which is connected to ground and the cathode of which is connected to the second comparator.

13. The circuit as claimed in claim 5, wherein the second reference voltage is equal to half of a maximum low input logic level.

* * * * *